(12) United States Patent
Allemand et al.

(10) Patent No.: US 9,493,873 B2
(45) Date of Patent: Nov. 15, 2016

(54) METHOD FOR PREPARING A COATING FOR PROTECTING A PART AGAINST OXIDATION

(71) Applicants: COMMISSARIAT A L'ENERGIE ATOMIQUE ET AUX ENERGIES ALTERNATIVES, Paris (FR);
(Continued)

(72) Inventors: Alexandre Allemand, Bordeaux (FR); Olivier Szwedek, Chambray-les-Tours (FR);
(Continued)

(73) Assignees: COMMISSARIAT A L'ENERGIE ATOMIQUE ET AUX ENERGIES ALTERNATIVES, Paris (FR);
(Continued)

( * ) Notice: Subject to any disclaimer, the term of this patent is extended or adjusted under 35 U.S.C. 154(b) by 0 days.

(21) Appl. No.: 14/360,407

(22) PCT Filed: Nov. 23, 2012

(86) PCT No.: PCT/EP2012/073524
§ 371 (c)(1),
(2) Date: May 23, 2014

(87) PCT Pub. No.: WO2013/076274
PCT Pub. Date: May 30, 2013

(65) Prior Publication Data
US 2014/0287249 A1    Sep. 25, 2014

(30) Foreign Application Priority Data
Nov. 25, 2011 (FR) .................................. 11 60815

(51) Int. Cl.
*C23C 16/30*    (2006.01)
*C23C 16/32*    (2006.01)
(Continued)

(52) U.S. Cl.
CPC ............. *C23C 16/22* (2013.01); *C04B 41/009* (2013.01); *C04B 41/52* (2013.01); *C04B 41/89* (2013.01);
(Continued)

(58) Field of Classification Search
CPC ..................... C23C 16/30; C23C 16/32; C23C 16/38; C23C 16/40
See application file for complete search history.

(56) References Cited

U.S. PATENT DOCUMENTS 3,241,956 A    3/1966    Inoue
3,250,892 A    5/1966    Inoue
(Continued)

FOREIGN PATENT DOCUMENTS

CN    102167623 A    8/2011
EP    2166601 A1    3/2010
(Continued)

OTHER PUBLICATIONS

Yun, Jondo, et al., "Crack-healing capability and high temperature oxidation resistance of multilayer coatings for carbon-carbon composites". Journal of Ceramic Processing Research, vol. 10, No. 3, pp. 340-343 (2009).*
(Continued)

*Primary Examiner* — Bret Chen
(74) *Attorney, Agent, or Firm* — Hultquist, PLLC; Mary B. Grant (57) ABSTRACT

A method is disclosed for coating, by means of a chemical vapor deposition (CVD) technique, a part with a coating (PAO) for protecting against oxidation. The method enables
(Continued)

the preparation of a refractory coating for protecting against oxidation, having a three-dimensional microstructure, which ensures the protection against oxidation at a high temperature, generally at a temperature above 1200° C., for materials that are sensitive to oxidation, such as composite materials, and in particular carbon/carbon composite materials.

22 Claims, 5 Drawing Sheets

(71) Applicants: CENTRE NATIONAL DE LA RECHERCHE SCIENTIFIQUE, Paris (FR)

(72) Inventors: Jean-Francois Epherre, Saugnac et Muret (FR); Yann Le Petitcorps, Leognan (FR)

(73) Assignees: CENTRE NATIONAL DE LA RECHERCHE SCIENTIFIQUE, Paris (FR)

(51) Int. Cl.

| | | |
|---|---|---|
| *C23C 16/22* | (2006.01) | |
| *C04B 41/89* | (2006.01) | |
| *C04B 41/00* | (2006.01) | |
| *C04B 41/52* | (2006.01) | |
| *C23C 16/02* | (2006.01) | |
| *C23C 16/04* | (2006.01) | |
| *C23C 16/06* | (2006.01) | |
| *C23C 16/34* | (2006.01) | |
| *C23C 16/38* | (2006.01) | |
| *C23C 16/40* | (2006.01) | |
| *C04B 111/00* | (2006.01) | |

(52) U.S. Cl.
CPC ......... *C23C 16/0272* (2013.01); *C23C 16/045* (2013.01); *C23C 16/06* (2013.01); *C23C 16/32* (2013.01); *C23C 16/325* (2013.01); *C23C 16/34* (2013.01); *C23C 16/38* (2013.01); *C23C 16/40* (2013.01); *C04B 2111/00982* (2013.01)

(56) References Cited

U.S. PATENT DOCUMENTS

| | | | |
|---|---|---|---|
| 3,446,607 A | | 5/1969 | Volk et al. |
| 3,503,118 A | | 3/1970 | Criscione et al. |
| 3,775,137 A | | 11/1973 | Clougherty et al. |
| 4,668,583 A | | 5/1987 | Olander |
| 5,283,109 A | | 2/1994 | Kaplan et al. |
| 5,614,162 A | | 3/1997 | Gribkov et al. |
| 5,725,955 A | | 3/1998 | Tawil et al. |
| 5,750,450 A | | 5/1998 | Bull et al. |
| 5,922,486 A | | 7/1999 | Chiao |
| 6,413,585 B1* | | 7/2002 | Madec .................. C04B 41/009 427/249.16 |
| 6,555,173 B1* | | 4/2003 | Forsythe ............... C04B 41/009 427/228 |
| 6,582,779 B2 | | 6/2003 | Li et al. |
| 2002/0081396 A1 | | 6/2002 | Li et al. |
| 2002/0165332 A1* | 11/2002 | Pope .................. C01B 21/0637 528/25 |
| 2004/0038032 A1* | 2/2004 | Walker ................. C04B 41/009 428/408 |
| 2004/0213906 A1* | 10/2004 | Mazany .................. C04B 35/83 427/249.1 |
| 2006/0008647 A1* | 1/2006 | Walker .................... C03C 1/008 428/408 |
| 2007/0154712 A1* | 7/2007 | Mazany ................ C04B 41/009 428/408 |
| 2008/0041674 A1* | 2/2008 | Walker .................. F16D 65/126 188/218 XL |
| 2008/0090071 A1 | 4/2008 | Valle et al. |
| 2010/0139840 A1 | 6/2010 | Allemand et al. |
| 2013/0082421 A1 | 4/2013 | Allemand et al. |
| 2014/0004271 A1 | 1/2014 | Allemand et al. |

FOREIGN PATENT DOCUMENTS

| | | |
|---|---|---|
| FR | 1475529 A | 3/1967 |
| FR | 2716208 A1 | 8/1995 |
| FR | 2932496 A1 | 12/2009 |
| JP | 6135721 A | 5/1994 |
| JP | 2000-277127 A | 10/2000 |
| WO | 9313033 A1 | 7/1993 |
| WO | 2004083147 A1 | 9/2004 |
| WO | 2009099447 A1 | 8/2009 |

OTHER PUBLICATIONS

Corral, Erica L., et al., "Ultra-High-Temperature Ceramic Coatings for Oxidation Protection of Carbon-Carbon Composites". J. Am. Ceram. Soc., 91 [5] 1495-1502 (2008).*

Suemitsu, Takeshi, et al., "Improvement of Oxidation Resistance of Carbon/Carbon Composites by the Multi-Layer CVD Coating Technique." Journal of the Ceramic Society of Japan 103 [5] 479-483 (1995).*

Zmij, V.I., et al., "Complex Protective Coatings for Graphite and Carbon-Carbon Composite Materials". Materials Sciences and Applications, 2015, 6, 879-888.*

Dahl, P., et al., "Densification and properties of zirconia prepared by three different sintering techniques", "Ceramics International", Sep. 12, 2006, pp. 1603-1610, vol. 33.

Han, K., et al., "Rate of Oxidation of Carbon Fiber/Carbon Matrix Composites with Antioxidation Treatment at High Temperature", "J. Electrochem. Soc.: Sold-State Science and Technology", Apr. 1987, pp. 1003-1009, vol. 134, No. 4.

Li, J., et al., Database WPI, "Thompson Scientific", AN 2011-M14927, XP-002679688, Jan. 1, 2011, no page numbers.

Liu, B., et al., "La0.9Sr0.1Ga0.8Mg0.2O3-delta sintered by spark plasma sintering (SPS) for intermediate temperature SOFC electrolyte", "Journal of Alloys and Compounds", Mar. 31, 2007, pp. 383-389, vol. 458.

McKee, D., et al., "Oxidation Behavior and Protection of Carbon/Carbon Composites", "Carbon", 1987, pp. 551-557, vol. 25, No. 4.

McKee, D., et al., "Chpater 3: Oxidation Protection of Carbon Materials", "Chemistry and Physics of Carbon (Ed.: Thrower, P.)", May 23, 1991, pp. 173-231, vol. 23, Publisher: CRC Press.

Munir, Z., et al., "The effect of electric field and pressure on the synthesis and consolidation of materials: A review of the spark plasma sintering method", "J. Mater. Sci.", Feb. 1, 2006, pp. 763-777, vol. 41.

Note: For the non-patent literature citations that no month of publication is indicated, the year of publication is more than 1 year prior to the effective filing date of the present application.

* cited by examiner

METHOD FOR PREPARING A COATING FOR PROTECTING A PART AGAINST OXIDATION

CROSS-REFERENCE TO RELATED APPLICATIONS

This application is a U.S. national phase under the provisions of 35 U.S.C. §371 of International Patent Application No. PCT/EP12/73524 filed Nov. 23, 2012, which in turn claims priority of French Patent Application No. 1160815 filed Nov. 25, 2011. The disclosures of such international patent application and French priority patent application are hereby incorporated herein by reference in their respective entireties, for all purposes.

TECHNICAL FIELD

The invention relates to a method for coating, using a chemical vapour phase deposition (CVD) technique, a part with a coating for protecting against oxidation More specifically, the invention relates to a method for coating at least one surface of at least one part made of at least one material capable of being oxidized, with a coating for protecting against oxidation.

The invention also relates to a coating for protecting against oxidation and to a part provided with such a coating.

The technical field of the invention may be defined in a general manner as that of protecting against oxidation or PAO.

The technical field of the invention is in particular that of protecting against oxidation at a high temperature, generally at a temperature above 1200° C., for materials that are susceptible to oxidation, such as composite materials and in particular carbon/carbon composite materials.

STATE OF THE PRIOR ART

Composite materials such as carbon/carbon (C/C) composite materials have been known for more than thirty years for their excellent temperature resistance and their resistance to thermal impacts. They conserve their tensile strength and their modulus at temperatures above 2000° C. However, within the context of prolonged use in oxidising medium, they rapidly lose any mechanical property, and do so from 400° C. It is to overcome this major problem that twenty or so years ago composites with SiC matrix and with C fibres were developed, firstly, then with SiC fibres when the latter became available on the market. However, although SiC/SiC or C/SiC composites have better oxidation resistance than C/C composites, they cannot be used at temperatures above 1200° C.

Coatings for protection against oxidation of materials based on C, and in particular C/C composite materials, may be of different chemical natures.

In particular, coatings based on noble metals, coatings based on phosphates; coatings based on boron oxide, borates or borides; coatings based on carbides may be distinguished.

A focus will firstly be made on coatings based on noble metals.

Among noble metals, iridium is particularly interesting in protecting against oxidation (PAO), due to its high melting temperature (2440° C.) and its very low oxygen permeability up to around 2100° C.

In the 1960s, iridium was particularly studied within the framework of the United States space programme [1]. The main problem that arises during the use of iridium in order to produce a PAO is the extreme volatility of iridium oxides ($IrO_2$ and $IrO_3$).

In addition, the expansion coefficient difference between iridium and carbon makes it difficult to obtain an adherent PAO.

However, dense depositions of iridium, adherent to carbon, have been obtained.

Thus, document [2] describes a method firstly comprising the deposition of a slurry of finely divided iridium powder on a graphite substrate, then the heating of the coated graphite substrate to a temperature above 2130° C. and for a sufficient time to obtain a molten iridium coating containing recrystallized graphite.

Document [3] describes a method for producing an iridium coating on a graphite substrate in which a slurry of iridium powder is deposited on a graphite substrate, then the graphite substrate is heated to produce by sintering an agglomerated iridium coating on said graphite substrate, said coating having, for example, a thickness of around 60 μm. A vapour phase deposition of iridium is then carried out on the agglomerated iridium coating, for example by sublimation of carbonyl or chlorocarbonyl iridium in an atmosphere of carbon oxide under reduced pressure between 300° C. and 800° C. The thickness of the deposition of iridium thereby produced is for example around 15 μm. A deposition is finally carried out using electroforming of a layer of iridium on iridium deposited in vapour phase.

It is possible to estimate the thickness of the final deposition at around 100 μm.

The PAO prepared in document [3] has been tested and it withstands oxidation in air, for example up to 2000° C., for 10 minutes, without degradation.

Furthermore, according to document [1], the recession rate of iridium under air at 2000° C. at atmospheric pressure is around 150 μm/hour.

In conclusion, the drawbacks of PAO based on noble metals like iridium are mainly the cost, and the formation of very unstable volatile species, such as $IrO_2$ and $IrO_3$.

Another category of coatings for protecting against oxidation is constituted of coatings based on phosphates.

Phosphate based enamels are often described in the literature, and in particular in document [1], for the protection of carbon materials.

Document [4] describes a method for achieving protection against oxidation of a product made of a composite material comprising carbon and having a ceramic surface in which is formed, on the ceramic surface, an external coating with a composition based on $P_2O_5$—$SiO_2$—$Al_2O_3$, and after drying, a heat treatment is carried out at a temperature at least sufficient to transform the external coating into an insoluble cement capable of forming a self-healing glass.

This type of phosphate based protection is, according to document [1], efficient for temperatures extending up to 1000° C.

The major drawback of phosphate based PAO is that they only ensure protection at temperatures below 1200° C.

Other PAO coatings are coatings based on boron oxide, borates or borides.

Coatings based on zirconium boride ($ZrB_2$) are, according to document [1], efficient for protecting, for a very short time, graphite up to 2200° C.

Boron oxide may also be employed to ensure the cohesion of refractory particles such as $ZrB_2$, $HfB_2$ or $ZrSi_2$ in order to form an impermeable coating at the surface of the material. After 10 hours under air at 1200° C., a composite C/C coated with such a protection is, according to document [5], still integral.

The main drawback of PAO based on borates, borides, or boron oxides is that there is always formation of $B_2O_3$, which volatilises from 1200° C.

PAO coatings may also be based on carbides.

Silicon carbide (SiC) is very interesting for producing PAO that withstand high temperatures, for example above 1200° C., because it forms with oxygen from the air an oxide which, above 1300° C., has the lowest permeability to oxygen of all oxides [1].

In addition, in certain temperature and $O_2$ partial pressure conditions, SiC forms a vitreous phase, which makes it possible, by overlying the carbon, to block potential pores and fissures.

This PAO seems to be efficient between 1000° C. and 1800° C. [1] as a function of the oxygen partial pressure.

Chemical vapour deposition (CVD) is the most widely employed means for depositing SiC with a view to producing a PAO [1].

Document [6] describes parts made of refractory materials prepared by hot compression of powders of $TiB_2$, $ZrB_2$, $HfB_2$, $NbB_2$, $TaB_2$ or mixtures thereof and 10% to 35% by volume of SiC. A preferred material is prepared by hot compression of powders of $ZrB_2$ and of SiC. These materials have good resistance to oxidation, to thermal stresses, and to ablation, and have good mechanical integrity.

Document [7] relates to ceramic composite compositions that withstand ablation at high temperature and which can in particular be used for the external thermal protection of space vehicles such as space shuttles.

These compositions comprise in particular mixtures of zirconium diboride and zirconium carbide with silicon carbide, mixtures of hafnium diboride and hafnium carbide with silicon carbide and mixtures of diborides and/or carbides of zirconium and hafnium with silicon carbide.

These ceramics are prepared by sintering under pressure a mixture of powders at a temperature that extends generally from 1850° C. to 2250° C.

Different compositions are tested under different thermal fluxes.

The composition constituted of ZrC (20% vol), $ZrB_2$ (16% vol) and the remainder of SiC, has, under a flow of 400 $W/cm^2$, under a pressure of 0.075 atm and at a temperature of 2180° C., an ablation rate of 1.97 µm/min. It is the best result obtained in document [7], in active oxidation condition of SiC.

Document [8] describes a coating made of refractory carbide for a surface of a carbon substrate, subject to constraints of temperature and abrasion, such as nozzle throats, turbine blades, heat shields and "hypersonic structures".

The carbon substrate may be made of pyrolytic carbon, or made of a carbon-carbon composite.

The coating is prepared by heating the substrate in a furnace under vacuum and by introducing a halide of a metal forming a carbide in the furnace. The metal forms a carbide with the carbon on a first portion of the surface of the substrate. Then, a gaseous hydrocarbide is added to the halide and a continuous layer of carbide is thereby formed on the first portion.

The preferred carbide is hafnium carbide HfC, but silicon carbide SiC, tantalum carbide TaC, zirconium carbide ZrC, and mixed carbides of silicon, tantalum or zirconium with hafnium may also be used.

This layer of carbide withstands fissuring and scaling.

It should be noted that, according to document [1], the most refractory carbide, which is HfC, seems to protect carbon up to 1300° C.

Another technique also used for depositing layers of carbide is the technique known as "pack cementation".

This technique, which is in particular described in document [9], consists in preparing a mixture of a powder of a refractory metal (for example chromium), a metal oxide (for example alumina) and a catalyst (for example ammonium chloride).

The mixture is then contacted with the carbon part to be coated, and the whole formed of the part and the mixture is heated to a temperature of 1000° C. under argon. The metal then reacts with the substrate to form a layer of carbide.

The main drawback of carbide based PAO is that it is obligatory in these PAO to combine several carbides.

In fact, no carbide is able, on its own, to ensure resistance at high temperature and low oxidation of the substrate.

Other PAO coatings, further, are multilayer coatings.

In fact, generally speaking, a PAO constituted of a single chemical compound is inoperative at high temperature, in other words a temperature generally above 1200° C.

It is in fact preferable, in order to overcome problems of oxygen diffusion, compatibility with carbon and harmony of expansion coefficients, to form a multilayer or multi-sequenced PAO.

Document [10] describes a refractory structure capable of withstanding in a prolonged manner temperatures exceeding at least around 2500° F. in an oxidising environment, which comprises a carbon-carbon composite substrate resistant to high temperatures and a coating resistant to oxidation at high temperature (namely a PAO) formed in situ on the surface of the substrate and comprising alternating thin layers of SiC and a carbide of a group IVB metal, such as HfC or ZrC. These alternating layers have a thickness of 1 to 10 µm and the total thickness of the PAC is around 130 to 500 µm.

The layer in contact with the CIC is preferably SiC.

The production of the layers takes place by chemical vapour deposition (CVD) at a temperature comprised between around 1090° C. and 1400° C. (more specifically at a temperature of around 1198° C.) under a pressure comprised between around 6 mbars and 667 mbars (more specifically at a pressure of around 26 mbars).

The precursor of SiC is methyltrichlorosilane (MTS) and that of HfC is hafnium tetrachloride obtained by flushing chlorine over hafnium metal at 510° C. The alternation of layers is obtained by opening or by cutting off the inflow of chlorine every 2 minutes.

The authors indicate that such a PAO efficiently protects a C/C for several hours at 1760° C. For shorter protection times, it withstands up to 1930° C.

The preparation of multilayer coatings in particular using a chemical vapour deposition method is however long, complex and costly, it requires multiple steps and complicated apparatus.

Furthermore, methods of preparing short fibres, also known as "crystal whiskers" or "whiskers", in particular of SiC, are known.

Generally speaking, the method used to grow SiC whiskers, in other words short, thin, elongated monocrystals, typically of 5 to 80 µm length, and 0.4 to 0.7 µm diameter, is a chemical vapour deposition (CVD) method or a chemical vapour infiltration (CVI) method implemented in the presence of catalysts or solvents.

In general, transition metal Fe, Ni, Cr, Mn . . . are used as catalyst, or instead other elements such as Al, or La, which may be in various chemical forms, for example in the form of oxides of these metals or elements.

As solvent, water or ethanol are generally used.

The role of the catalyst or the solvent is to form during the CVD/CVI process a solution in the form of a molten mass, of Me—Si—C type, Me representing the metal or the metals playing the role of solvent or catalyst, in which are present silicon and carbon.

In these conditions, the chemical vapour deposition takes place in a predominant manner at the surface of the droplets of molten mass according to the mechanism known as VLS (Vapour-Liquid-Solid Process), which ensures the axial growth of the SiC.

Thus, document FR-A1-2716208 [11] describes a method of preparing silicon carbide whiskers, and more particularly silicon carbide whiskers that can reach for example up to 100 mm, and mats thereof, on a substrate, by heat treatment, at a temperature of 1250° C. to 1500° C., of a gaseous mixture comprising hydrogen and sources of Si and C atoms, which are in the form of at least one oxygen-free compound, in the presence of a catalyst chosen from the metals group. During the growth period of this method, a two-component catalyst, Al—Fe, is introduced in the gaseous phase into the reaction zone, by means of a reduction by carbon of ceramics of aluminosilicate type, which ceramics comprise at least 73% by weight of alumina and 0.3% to 3% by weight of iron oxides; and the substrate is a carbon fabric based on carbonised rayon fibre, which fabric has been pre-treated before the carbonisation by a borax solution and a diammonium phosphate solution until the quantity of boron in the fabric does not reach more than 4% by weight and that the quantity of phosphorous does not reach more than 2% by weight.

The whiskers prepared are easily separated from the growth substrate.

It is pointed out that the whiskers prepared may be used as reinforcement materials by incorporation in composites based on metals, industrial ceramics, ceramic cutting tools, thermal insulation, etc.

Document [11] thus essentially relates to a method for preparing SiC whiskers, and recovering said whiskers at the end of the method with a view to their subsequent use.

The coating of these whiskers by another ceramic is neither described nor suggested in this document.

Similarly, the implementation of these whiskers to prepare a coating for PAO, and in particular to constitute the first layer of a multilayer PAO coating, is neither described nor suggested in document [11].

In light of the preceding, there thus exists a need for a method for preparing a multilayer coating for protecting against oxidation on a part made of a material capable of being oxidised, said coating being a coating conferring protection against oxidation at high temperatures, above for example 1200° C., and which could go up to 2000° C., or even 2500° C., for prolonged duration, which could reach several minutes, for example 10 minutes.

There exists in other words a need for a method for preparing a coating for protecting against oxidation that is also refractory, or even highly refractory.

There exists in particular a need for a method for preparing a coating that ensures efficient protection against oxidation, at high temperatures, of parts made of carbon-carbon composite materials.

There further exists a need for such a method for a multilayer coating that is simple, reliable, rapid, inexpensive, and which makes it possible to obtain a coating of quality, dense and as far as possible free of cracks.

The goal of the invention is to provide a method for preparing a multilayer coating for protecting against oxidation on at least one surface of at least one part made of at least one material capable of being oxidized that meets, among other things, this need and which does not have the drawbacks, defects, limitations and disadvantages of the methods of the prior art and which resolves the problems of the methods of the prior art.

DESCRIPTION OF THE INVENTION

This goal, and yet others, are achieved, according to the invention, by a method for preparing a multilayer coating for protecting against oxidation on at least one surface of at least one part made of at least one material capable of being oxidised, in which the following successive steps are carried out:

a) on the surface is deposited a layer of a catalyst enabling the growth of short fibres made of a ceramic that resists oxidation;

b) on the surface is grown, using a chemical vapour deposition CVD method or a chemical vapour infiltration CVI method, a first layer constituted of particles of a ceramic that resists oxidation, said particles comprising a majority of short fibres made of a ceramic that resists oxidation;

c) the first layer is coated, using a chemical vapour deposition CVD method or chemical vapour infiltration CVI method, in a totally homogeneous manner, fibre by fibre and without leaving any porosity, with a second layer made of a refractory ceramic;

d) the second layer is coated, using a chemical vapour deposition CVD method or chemical vapour infiltration CVI method, with a third layer made of a ceramic that resists oxidation;

e) optionally, the third layer is coated, using a chemical vapour deposition CVD method or chemical vapour infiltration CVI method, with a fourth layer made of a refractory ceramic;

f) optionally the fourth layer is coated, using a chemical vapour deposition CVD method or chemical vapour infiltration CVI method, with a fifth layer made of a ceramic that resists oxidation;

g) optionally, steps e) and f) are repeated 1 to 100 times, preferably 1 to 50 times;

h) the part is recovered, coated on at least one of its surfaces with a refractory coating for protecting against oxidation, said coating having a three-dimensional microstructure up to the third layer or up to the optional fifth layer; the ceramic that resists oxidation being different to the refractory ceramic.

More exactly, it could be said that the ceramics that resist oxidation are different to the refractory ceramics.

Ceramic that resists oxidation "different" to the refractory ceramic is generally taken to mean that the ceramic that resists oxidation is of a different chemical nature to the refractory ceramic.

It is pointed out that the layers optionally deposited during step g) are two-dimensional layers.

It is pointed out that the chemical vapour deposition CVD method is not fundamentally different to the chemical vapour infiltration CVI method.

The CVD method differs however from the chemical vapour infiltration CVI method by the fact that the pressure implemented in a CVD method is, generally speaking, higher than the pressure implemented in a CVI method.

Thus, in the case of a CVI method, the pressure implemented is generally 0.1 kPa to 5 kPa, whereas it is generally more than 5 kPa and up to atmospheric pressure in the case of a CVD method.

Advantageously, said particles of the first layer comprise 100% short fibres. In other words, said particles are all short fibres.

Advantageously, the short fibres comprise a majority proportion of short fibres that are substantially perpendicular, or perpendicular, to the surface, preferably all the short fibres, in other words 100% of the short fibres, are substantially perpendicular, or perpendicular, to the surface.

"Substantially perpendicular" is taken to mean that the angle between the fibres and the surface is 90° more or less 5°.

Advantageously, the material capable of being oxidised is selected from carbon based materials such as carbon/carbon composite materials; ceramics such as boride ceramics like $HfB_2$, carbide ceramics with the exception of SiC like TiC, ZrC, and HfC, nitride ceramics like TiN and ZrN; composite ceramics such as SiC/SiC composite ceramics; ultra-refractory metals such as W or Ta; and carbon/ceramic composites such as C/SiC composites.

Generally, the material capable of being oxidized is obviously different to the ceramic that resists oxidation constituting the particles of the first layer (step b)).

Advantageously, the catalyst enabling the growth of short fibres is selected from particles of diamond; particles of at least one metal, such as particles of Cu, Cr, Fe, Ni, and Al, and particles of mixtures and alloys thereof.

Advantageously, the short fibres have a length of 1 nm to 200 μm and a diameter of 50 nm to 1 μm.

Advantageously, the second layer has a thickness of 1 nm to 10 μm, preferably 100 nm to 5 μm, even more preferably 2 to 3 μm.

Advantageously, the third layer has a thickness of 1 nm to 10 μm, preferably 100 nm to 5 μm, even more preferably 2 to 3 μm.

Advantageously, the fourth layer has a thickness of 1 nm to 10 μm, preferably 100 nm to 5 μm, even more preferably 2 to 3 μm.

Advantageously, the fifth layer has a thickness of 1 nm to 10 μm, preferably 100 nm to 5 μm, even more preferably 2 to 3 μm.

Preferably all the layers from the second layer have the same thickness.

As has already been indicated, the ceramic that resists oxidation is different to the refractory ceramic.

Advantageously, the refractory ceramic is selected from oxide ceramics, nitride ceramics, boride ceramics, carbide ceramics; mixtures thereof (preferably with each other); and composite ceramics thereof (preferably with each other).

Advantageously, the ceramic that resists oxidation is selected from carbide ceramics, nitride ceramics, boride ceramics, oxide ceramics; mixtures thereof (preferably with each other); and composite ceramics thereof (preferably with each other); the ceramic that resists oxidation being different to the refractory ceramic.

Preferably, the refractory ceramic is selected from metal carbides with the exception of SiC, such as HfC, ZrC, TiC, TaC, and WC; mixtures of said metal carbides with each other, and mixtures of one or more of said metal carbides with SiC (with generally a minority proportion by weight of SiC); composite ceramics of said metal carbides with each other, and composite ceramics of one or more of said metal carbides with SiC (with generally a minority proportion by weight of SiC).

Preferably, the ceramic that resists oxidation is selected from SiC, TiN, ZrN, $HfB_2$, $ZrB_2$; mixtures thereof; and composite ceramics thereof.

In a particularly preferred embodiment form, the ceramic that resists oxidation is SiC, and the refractory ceramic is HfC.

Advantageously, the particles of the first layer, the third layer, the fifth layer, and the optional layers made of a ceramic that resists oxidation prepared during step g) are constituted of a same ceramic, preferably SiC; and the second layer, the fourth layer and the optional layers made of a refractory ceramic prepared during step g) are constituted of a same ceramic, preferably HfC.

Advantageously, the refractory coating for protecting against oxidation has a thickness of 4 nm to 1000 μm, preferably 10 nm to 600 μm.

Advantageously, steps b) to g), are all carried out continuously in a same chemical vapour deposition CVD or chemical vapour infiltration CVI reactor.

Advantageously, steps b) to g), are all carried out at a same pressure of 0.5 kPa to 50 kPa, for example 5 kPa, and a same temperature of 500° C. to 1500° C., for example 1000° C.

The method according to the invention differs fundamentally from methods for preparing coatings for protecting against oxidation of the prior art, such as those that have been mentioned above.

The method according to the invention has a specific sequence of specific steps that has never been described in the prior art.

None of the documents of the prior art cited above mentions a method for preparing a multilayer coating for PAO in which are deposited alternately, using a chemical vapour deposition technique, layers of a ceramic that resists oxidation and layers of a refractory ceramic, the first layer deposited being a layer comprising, preferably constituted of, short fibres made of a ceramic that resists oxidation, the short fibres being preferably all substantially perpendicular to the surface.

It is in particular this step b) of the method according to the invention, during which a "forest" of short fibres, also known as "whiskers", is deposited, that fundamentally differentiates the method according to the invention from methods of the prior art.

This first layer is then covered with a second layer made of refractory ceramic c) then a third layer made of a ceramic that resists oxidation d). Then it is possible to optionally deposit a fourth layer made of a refractory ceramic e), then a fifth layer made of a ceramic that resists oxidation f), then optionally repeating steps e) and f) as many times as necessary to obtained the desired thickness of PAO.

In the method according to the invention, apart from step a) of deposition of a catalyst layer, all of steps b) of g) of deposition of the different layers of the multilayer coating take place using a same chemical vapour deposition CVD/CVI technique, which largely simplifies the method according to the invention.

This deposition technique brings numerous advantages, in particular low contamination of layers, obtaining dense depositions of controlled composition, the possibility of preparing a multilayer coating, for example HfC:SiC with thin layers, for example a thickness of 1 nm to 10 μm, preferably 100 nm to 5 μm, even more preferably 2 to 3 μm.

"Dense depositions" is generally taken to mean that said depositions have a density of more than 95%, preferably more than 98%, or even 100% of the theoretical density of the material: this is then known as total densification. These dense depositions are generally without porosities visible by Scanning Electron Microscope (SEM).

To summarize, the method according to the invention does not have the drawbacks, defects, limitations and disadvantages of methods of the prior art and provides a solution to the problems of methods of the prior art.

In particular, the method according to the invention compared to the main types of methods for preparing PAO mentioned above has the following advantages:
it is easy to implement;
it makes it possible to obtain dense depositions as defined above;
the depositions obtained have a particular three-dimensional microstructure, with a specific first layer comprising, preferably constituted of, a forest of short fibres or whiskers of a ceramic that resists oxidation.

The coating for protecting against oxidation obtained by this method has a specific three-dimensional microstructure, combining in a synergetic manner oxidation resistance with ultra-refactoriness; this original microstructure is due in an inherent manner to the method that has been used to prepare it and in particular to step b) of this method during which the deposition is carried out of a first specific layer comprising, preferably constituted of, a "forest of fibres".

It is not possible to obtain this unique specific three-dimensional microstructure using a method other than the method of the invention.

In particular, the method according to the invention makes it possible, in a surprising manner, to obtain the totality of this specific three-dimensional microstructure using a chemical vapour deposition CVD method whereas, until now, and as document [10] shows, it was thought that chemical vapour deposition CVD could only produce a 2D stack of layers.

According to the invention, the alternation of layers is thus realised no longer as a simple stack of layers in two dimensions, as is the case in document [10], but by beginning with the deposition, as first layer, of a specific layer comprising, preferably constituted of, a forest of short fibres that is then covered in a homogeneous manner and without porosity with a second layer made of a refractory ceramic then with a third layer made of a ceramic that resists oxidation, optionally with fourth and fifth layers, and further optionally by an alternation of 2D layers.

It should be noted that the coating becomes two-dimensional "2D" from the fourth layer, or from the alternation of layers that follows the optional fifth layer.

Up to the third layer or up to the fifth layer, if the latter is present, the coating has a three-dimensional microstructure. Thanks to the method of the invention, a PAO coating globally with three-dimensional microstructure is thereby obtained that combines in a synergetic manner two advantageous properties, namely refractoriness and oxidation resistance.

It has been effectively shown on a C, or C/C substrate, that such a PAO coating was dense (density greater than or equal to 95%, or even greater than or equal to 98%, even equal to 100%) and non-fissured.

When the substrate is made of a material such as a C/C composite material, the method according to the invention makes it possible to combine, with the thermostructural properties of the composites, efficient protection against oxidation at a high temperature, namely generally above 1200° C. and which can reach 2000° C., or even 2500° C. for a prolonged duration, for example up to 10 minutes.

The PAO coating prepared by the method according to the invention has much better resistance to oxidation than PAO coatings of the prior art and in particular two-dimensional PAO coatings such as those described in document [10].

Thus, it has been shown in the examples that follow that a PAO coating obtained by the method according to the invention was efficient after an oxidation treatment under air carried out at a temperature that can go up to 2000° C. and for a long duration of 205 seconds, whereas the two-dimensional PAO coating of document [10] was no longer efficient from 1800° C.

In conclusion, the method according to the invention results in a coating, the microstructure of which is globally three-dimensional, which has the effect of improving the anchoring of the coating on the substrate and in addition, during oxidation, this microstructure leads to a synergy between refractory ceramics on the one hand and ceramics that resist oxidation on the other hand, in particular when said ceramics are carbide ceramics, and in particular when the refractory ceramic is HfC and the ceramic that resists oxidation is SiC.

The chemical reaction between $O_2$ and the two ceramics, in particular the two carbide ceramics, in particular SiC and HfC, lead locally and simultaneously to the formation of two oxide compounds, in one of which the oxygen is in oxidation state 4 and which is liquid below 2000° C. In the case where the two ceramics are SiC and HfC, said two compounds are $HfO_2$, which is solid at 200° C. and highly refractory, and another oxide, $HfSiO_4$ which is liquid at 2000° C. and which fills the porosities of $HfO_2$.

In the case of only two-dimensional layers (document [10]), the reaction is only successive and thus less "intimate" than with the three-dimensional microstructure obtained according to the invention.

The invention further relates to a refractory multilayer coating for protecting against oxidation comprising the following succession of layers:
a first layer constituted of particles of a ceramic that resists oxidation, said particles comprising a majority of short fibres made of a ceramic that resists oxidation;
a second layer made of a refractory ceramic that coats the first layer in a totally homogeneous manner, fibre by fibre and without leaving any porosity;
a third layer made of a ceramic that resists oxidation;
optionally a fourth layer made of a refractory ceramic;
optionally a fifth layer made of a ceramic that resists oxidation;
optionally a succession, repeated 1 to 100 times, preferably 1 to 50 times, of a layer made of a refractory ceramic and of a layer made of a ceramic that resists oxidation;
said coating having a three-dimensional microstructure up to the third layer or up to the optional fifth layer; the ceramic that resists oxidation being different to the refractory ceramic.

More exactly, it could be said that the ceramics that resist oxidation are different to the refractory ceramics.

This coating is intrinsically novel and has advantageous properties that have already been largely described above.

The invention finally relates to a part made of at least one material capable of being oxidized, coated on at least one of its surfaces with said refractory multilayer coating for protecting against oxidation.

Other characteristics and advantages of the invention will become clearer on reading the description that follows.

In this detailed description, in particular the description that has been made above of the method according to the invention is completed, the installation used to implement the method according to the invention and examples of embodiments of PAO coatings formed using the method according to the invention as well as a comparative coating are described.

This description, given by way of illustration and non-limiting, is made with reference to the appended Figures, in which:

BRIEF DESCRIPTION OF THE DRAWINGS

The scale represented in FIG. 4A is 100 µm, and the scale represented in FIG. 4B is 10 µm.

FIG. 5A shows the microstructure of the coating after the successive deposition of five layers of carbide. FIG. 5B is a partial view of FIG. 5A, which shows the growth of SiC fibres. FIG. 5C is a partial view of FIG. 5A, which shows the alternation of the 5 layers deposited successively.

The scale represented in FIG. 5A is 20 µm.

The scale represented in FIG. 6 is 30 µm.

DETAILED DESCRIPTION OF PARTICULAR EMBODIMENTS

The method according to the invention is a method for preparing a multilayer coating for protecting against oxidation on at least one surface of at least one part made of at least one material capable of being oxidised, which comprises the successive steps a) to h) mentioned above.

During step a) of the method according to the invention, a layer of a catalyst enabling the growth of short fibres made of a ceramic that resists oxidation is deposited on said surface of the part.

According to the invention, the part to be coated is generally made of a material capable of being oxidised.

"Material capable of being oxidised" or "material susceptible to oxidation", is generally taken to mean, according to the invention, a material, the weight loss or gain of which is significant after heat treatment in the presence of oxygen compared to a material, such as a ceramic, which resists oxidation as will be defined below, in particular in relation with the concept of forming a passivating layer.

The material capable of being oxidised is generally selected from carbon based materials such as carbon/carbon composite materials; ceramics such as boride ceramics like $HfB_2$, carbide ceramics with the exception of SiC like TiC, ZrC, and HfC, nitride ceramics like TiN and ZrN; composite ceramics such as SiC/SiC composites; ultrarefractory metals such as W or Ta; and carbon/ceramic composites such as C/SiC composites.

"Material based on carbon" is generally taken to mean a material that comprises more than 50%, preferably more than 80%, even more preferably more than 90% by weight of carbon, even better 100% by weight of carbon.

The part to be coated may have any shape and size, on the condition nevertheless that it can be arranged in a chemical vapour deposition (CVD) reactor.

Generally, the material capable of being oxidized is obviously different to the ceramic that resists oxidation constituting the particles of the first layer (step b)).

The catalyst favouring the growth of short fibres is generally in the form of particles chosen from particles of diamond and particles of at least one metal chosen preferably from Cu, Cr, Fe, Ni, Al and mixtures and alloys thereof.

The deposition of the catalyst layer may be carried out for example by immersing, dipping the surface in a bath of a suspension (slurry) containing the catalyst particles.

For example, the surface could be dipped for a duration for example of 15 minutes in an aqueous slurry of fine particles (in other words, the largest dimension of which, such as the diameter, is generally 10 nm to 3 µm) of a metal chosen for example from Ni, Fe, Al, Cr Cu, and mixtures and alloys thereof.

It is also possible to use a solution of at least one metal salt, for example a salt of one of the metals cited above such as nickel nitrate, or aluminium nitrate, for example at a concentration of $2 \cdot 10^{-2}$ mol/L and dipping the surface in this solution for example for a duration of 15 minutes. The surface is then made to undergo a heat treatment to transform the salt deposited into catalytic metal particles. The layer of catalyst particles generally has a thickness of 1 nm to 5 µm, preferably 20 nm to 3 µm.

The layer of catalyst particles may be continuous or discontinuous with catalyst particles deposited in a discrete manner on the surface.

On the coated surface of the catalyst layer, using a chemical vapour deposition CVD method or chemical vapour infiltration CVI method, a first layer constituted of particles of a ceramic that resists oxidation is then made to grow, said particles comprising a majority of short fibres made of a ceramic that resists oxidation.

As has already been indicated above, said particles preferably comprise 100% short fibres.

Preferably, moreover, the short fibres comprise a majority proportion of short fibres that are substantially perpendicular to the surface, preferably all the short fibres are substantially perpendicular to the surface.

To simplify things hereafter, the first layer is referred to as "short fibre layer", even if said first layer is not always exclusively constituted of short fibres.

The short fibres are made of a ceramic that resists oxidation, in other words made of a ceramic that has good oxidation resistance.

"Ceramic that resists oxidation" is generally taken to mean a ceramic that exhibits a low weight loss or gain in the presence of an oxygen partial pressure and at temperature.

This low weight loss or gain in the presence of an oxygen partial pressure and at temperature changes according to the ceramics and may be determined by the man skilled in the art.

For example HfC alone, under oxidation, is rapidly transformed from 400° C. into $HfO_2$ which is porous with a weight gain.

On the other hand, SiC is passivated by forming on its surface a layer of $SiO_2$ liquid (glass), which is an oxygen diffusion barrier, and the SiC is thus protected by its layer of $SiO_2$.

In the case of SiC, which resists oxidation well, there is thus a weight variation, but very low compared to that of HfC.

A more precise definition could thus be the following: an oxide ceramic or instead a carbide, nitride, or boride ceramic that resists oxidation well is a ceramic which, treated under air at temperatures comprised between 400° C. and the melting or decomposition temperature of said ceramic has at its surface an associated passivating layer of oxide (for example $SiO_2$ for SiC) which prevents or slows down any diffusion of oxygen towards the ceramic.

The ceramic that resists oxidation is generally selected from carbide ceramics, nitride ceramics, boride ceramics, oxide ceramics, (it may be envisaged to coat the HfC with $SiO_2$ for example); mixtures thereof (preferably with each other), and composite ceramics thereof (preferably with each other); the ceramic that resists oxidation being different to the refractory ceramic.

Among carbide ceramics, may be cited for example SiC, ZrC, HfC, and TaC; among nitride ceramics, may be cited TiN, and ZrN; among boride ceramics, may be cited $HfB_2$ and $ZrB_2$.

It is moreover advantageous to choose as ceramic that resists oxidation a ceramic that has a thermodynamic equilibrium with the refractory ceramic that constitutes the second layer, whatever the temperature.

The man skilled in the art, potentially by resorting to data available in the literature, will easily know how to determine for a given ceramic that resists oxidation, the refractory ceramics that meet these conditions of thermodynamic equilibrium, and vice and versa.

The short fibres of the first layer are preferably made of SiC.

According to the invention, the short fibres of the first layer and preferably all the short fibres of the first layer are arranged in a substantially perpendicular manner, and preferably in a perpendicular manner, to the surface and this first layer may thus be compared to a "forest" of short fibres, in which the fibres would be like tree trunks.

These short fibres generally have a length of 1 nm to 200 µm

These short fibres generally have a circular or substantially circular section with a diameter for example of 50 nm to 1 µm.

According to the invention, the growth of the first layer of short fibres on the surface of the catalyst layer is carried out using a chemical vapour deposition CVD method or chemical vapour infiltration CVI method.

Such a chemical vapour deposition method is well known to the man skilled in the art.

It consists in contacting the surface of the catalyst layer with reactive gases that react with the catalyst particles to form short fibres.

The reactive gases generally comprise a gas of at least one precursor compound of the ceramic that resists oxidation, and optionally at least one reducing gas.

The precursor compound(s) and the reducing gas may be easily chosen by the man skilled in the art as a function of the ceramic that resists oxidation that constitutes the fibres.

Thus, in the case where the ceramic that resists oxidation is SiC, the reactive gases comprise a gas of a precursor compound chosen generally from silanes such as methyltrichlorosilane (MTS), and at least one reducing gas, which is generally hydrogen.

Hydrogen intervenes in the chemical vapour deposition of SiC by reducing successively the precursor.

The reactive gases are generally conveyed onto the surface in the form of a mixture with a neutral or inert vector gas chosen generally from the noble gases, such as argon, nitrogen, and mixtures thereof.

The growth of the first layer of short fibres is generally carried out in a CVD reactor or furnace, in the following conditions:

Pressure in the reactor: 0.5 to 50 kPa, preferably 5 kPa;
Temperature: 700° C. to 1500° C., preferably 1000° C.;
Flow rates:
Flow rate of gas of precursor compound(s): 0.02 to 1 L/min;
Flow rate of reducing gas(es): 0.2 to 2 L/min;
Flow rate of vector gas: 0 to 2 L/min.
Flow rate of reducing gas(es)/Flow rate of gas of precursor compound(s) ratio from 1 to 10.

The gas flow rates and the ratio of flow rates mentioned above vary according to the reducing gas(es) and the precursor compound(s).

Thus, in the case of the deposition of a layer of short fibres made of SiC, the ratio of the Flow rate of reducing gas(s)/Flow rate of gas of precursor compound(s), for example Flow rate of hydrogen/Flow rate of methyltrichlorosilane, is 4.

Duration of deposition of this layer: 10 min to 5 hours, preferably 2 hours.

Then the first layer is coated with short fibres made of a ceramic that resists oxidation, using a chemical vapour deposition CVD method or chemical vapour infiltration CVI method, in a totally homogeneous manner, fibre by fibre and without leaving any porosity, with a second layer made of a refractory ceramic.

The refractory ceramic of the second layer is different to the ceramic that resists oxidation of the first layer of short fibres.

"Refractory ceramic" is generally taken to mean a ceramic that has a sintering temperature above 1300° C.

The refractory ceramic may be selected from oxide ceramics, nitride ceramics, boride ceramics, carbide ceramics; mixtures thereof (preferably with each other), and composite ceramics thereof (preferably with each other).

Advantageously, the refractory ceramic is selected from metal carbides with the exception of SiC such as HfC, ZrC, TiC, TaC, WC; mixtures of said metal carbides with each other, and mixtures of one or more of said metal carbides with SiC (with generally a minority proportion by weight of SiC); composite ceramics of said metal carbides with each other, and composite ceramics of one or more of said metal carbides with SiC (with generally a minority proportion by weight of SiC).

The refractory ceramic may even be a ceramic qualified as "ultrarefractory" ceramic.

Such an ultrarefractory ceramic generally has a sintering temperature above 1300° C.

An example of such an ultrarefractory ceramic is HfC.

As an example, the second layer may be a layer of an ultrarefractory ceramic, for example HfC, ZrC, TaC, which covers a first layer of SiC that has good oxidation resistance and a thermodynamic equilibrium with HfC whatever the temperature, for example between 500° C. and 2850° C.

The second layer made of a refractory ceramic generally has a thickness of 1 nm to 10 µm, for example 2 microns.

The deposition of the second layer made of a refractory ceramic is generally carried out in a CVD/CVI furnace or reactor, in the same way as the deposition of the first layer, by choosing obviously suitable reactive gases enabling the deposition of a layer of the desired refractory ceramic.

Thus, in the case where the refractory ceramic is HfC, the reactive gases comprise a gas of a precursor compound chosen generally from $HfCl_x$ where x is a whole number from 1 to 4 ($HfCl_x$ represents a mixture of chlorides in which the chloride of $HfCl_4$ is generally majority), methane, and at least one reducing gas, which is generally hydrogen. The supply of $HFCl_4$ is carried out by means of an "ex-situ" chlorination furnace.

The conditions of this deposition are analogous to those mentioned for the first layer, in particular as regards the temperature, the pressure and the duration of the deposition operation.

As has been indicated above, the gas flow rates and the ratio of flow rates mentioned above vary according to the reducing gas(es) and the precursor compound(s).

Thus, in the case of the deposition of a refractory ceramic layer that is HfC, the ratio of the Flow rate of reducing gas(es)/Flow rate of gas of precursor compound(s), for example Flow rate of hydrogen/Flow rate of $HfCl_x$, is 8.5.

In the correct conditions of temperature and pressure as defined above, it is possible to carry out an infiltration of the refractory ceramic of the second layer.

During the deposition of the second layer, the precursor (the precursors) is not a liquid but a gas (on account of the very principle of the CVD or CVI methods). The gaseous precursor can penetrate absolutely into all the porosities of the first layer of short fibres, which gives a dense material as defined above, for example a material with a density of 100% (total densification, in other words equal to 100% of the theoretical density of the material), without post-heat treatment step (see figures).

Then the second layer is coated, using a chemical vapour deposition CVD method or a CVI method, with a third layer made of a ceramic that resists oxidation. This ceramic that resists oxidation is selected from the ceramics that resist oxidation already mentioned above.

The ceramic that resists oxidation of the third layer is obviously different to the refractory ceramic of the second layer.

Preferably, the ceramic that resists oxidation of the third layer is the same ceramic that resists oxidation as that of the first layer of short fibres, for example said ceramic is SiC. Or instead the ceramic that resists oxidation of the third layer may be different to the ceramic that resists oxidation of the first layer.

The deposition of the third layer made of a ceramic that resists oxidation is generally carried out in a CVD/CVI reactor or furnace, in the same way as the deposition of the first layer, and the deposition of the second layer by choosing obviously suitable reactive gases enabling the deposition of a layer of the desired ceramic.

Thus, as has already been seen above, in the case where the ceramic that resists oxidation is SiC, the reactive gases comprise a gas of a precursor compound chosen generally from silanes such as methyltrichlorosilane (MTS), and at least one reducing gas, which is generally hydrogen.

The conditions of this deposition of the third layer are analogous to those mentioned for the first layer, in particular as regards the temperature, the pressure and the duration of the deposition operation, and the flow rates.

The third layer generally has a thickness of 1 nm to 10 µm.

Optionally, the third layer is coated, using a chemical vapour deposition CVD method or a CVI method, with a fourth layer made of a refractory ceramic, which is generally the same ceramic as the refractory ceramic of the second layer, for example HfC. Or instead the refractory ceramic of the fourth layer is different to the refractory ceramic of the second layer.

The refractory ceramic of the fourth layer is obviously different to the ceramic that resists oxidation of the third layer.

The deposition of the fourth layer is carried out in exactly the same way as the deposition of the second layer.

The fourth layer generally has a thickness of 1 nm to 10 µm.

Finally, in a last step, optionally using a chemical vapour deposition CVD method or a CVI method, a fifth layer made of a ceramic that resists oxidation is optionally deposited, which is preferably identical to the ceramic of the third layer and the first layer, such as SiC.

But the ceramic that resists oxidation of the fifth layer may be different to the ceramic of the third layer and/or the first layer.

The ceramic that resists oxidation of the fifth layer is obviously different to the refractory ceramic of the fourth layer.

The deposition of this fifth layer made of a ceramic that resists oxidation is carried out in exactly the same way as the deposition of the first and third layers.

This fifth layer generally has a thickness of 1 nm to 10 µm.

At the end of the deposition of the final, last, layer the part is recovered, coated on at least one of its surfaces with a refractory coating for protecting against oxidation (PAO), with a three-dimensional microstructure.

The PAO thereby obtained has an alternation of at least three layers (in the case where the deposition of the fourth and fifth layers is not carried out) of ceramics having good oxidation resistance (type SiC) and of refractory ceramic (type HfC).

The microstructure thereby obtained, due to the deposition of short fibres and in particular a forest of short fibres in the first step, has a microstructure that can be qualified as an alternating three-dimensional microstructure.

Preferably, all the steps of deposition of layers using CVD or CVI, in other words the steps of deposition using CVD or CVI of the first, second and third layers, of the optional fourth and of the fifth layers, are all carried out continuously in a same chemical vapour deposition CVD or chemical vapour infiltration CVI reactor, while changing only a limited number of parameters between steps.

In other words, the deposition of these layers may be carried out in a single step and continuously by changing a minimum of parameters between the depositions of layers.

Generally, the pressure, the temperature and the duration of each of the layer deposition steps are identical and only the nature of the gases of precursors compounds and the reducing gases and the flow rate of said gases change.

It is possible to continue to stack two-dimensional layers on the three-dimensional PAO obtained at the end of the deposition of the fifth layer, following the example of what is described in patent [10], to the description of which reference may be made.

Thus, on the fifth layer could be deposited an alternation of layers made of a refractory ceramic analogous to the second or fourth layer, and layers made of a ceramic that resists oxidation analogous to the third layer.

To deposit this alternation of layers, the successive steps of deposition of the second then of the third layer may be repeated 1 to 100 times, preferably 1 to 50 times.

For example, on a three-dimensional PAO of 5 layers, 10 two-dimensional layers could further be deposited.

Preferably, all the ceramics that resist oxidation that are deposited during these steps are identical to the ceramic of the third layer and the first layer, such as SiC, and all the refractory ceramics that are deposited during these steps are identical to the refractory ceramic of the fourth layer and the second layer, such as HfC.

A description is given hereafter of the installation used to implement the method according to the invention, more specifically the installation known as CVD or CVI installation is described that is used to carry out the deposition on the substrate of the first layer of short fibres and following layers of refractory ceramic or ceramic resistant to oxidation (steps b) to g) of the method according to the invention).

Step a) of the method according to the invention, during which a layer of a catalyst is deposited on the surface of the substrate enabling the growth of short fibres made of a ceramic that resists oxidation, is carried out beforehand in a separate installation and the substrate, of which at least one surface has thus been coated with a catalyst layer, is then treated during steps b) to g) in the CVD or CVI installation, which is described hereafter.

The installation that is described hereafter is more particularly an installation that enables the deposition of a coating comprising alternating layers of SiC and HfC, but such an installation could also be used for the deposition of coatings comprising layers of ceramics other than SiC and HfC, providing several potential adaptations within the reach of the man skilled in the art in this technical field are made.

Furthermore, the reactive gases and precursors mentioned in the description that follows are the reactive gases and precursors used for the preparation of layers of SiC and HfC, but these reactive gases and precursors are only given as examples and those skilled in the art will easily be able to choose the nature of the reactive gases and precursors in order to prepare layers made of other ceramics.

Figure 1:
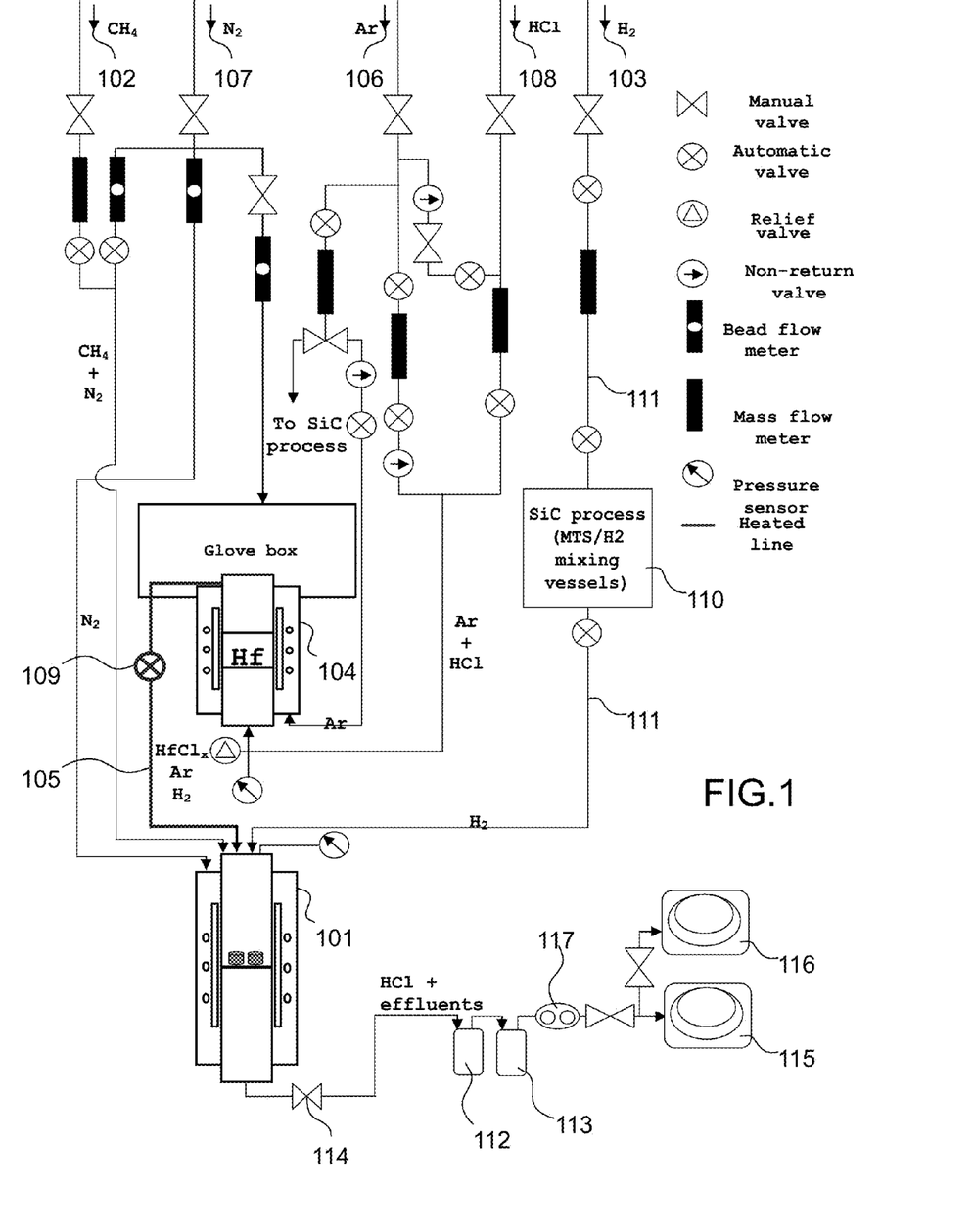
FIG. 1 is a schematic view of an installation for the implementation of the method according to the invention.

FIG. 1 shows an overall view of the installation as a whole. This may be broken down into three parts, a precursor gas, vector gas, and reducing gas supply system; the CVD/CVI deposition furnace; and finally a system for treating effluents and unreacted gaseous products.

System for Supplying with Precursor Gases, Vector Gas, and Reducing Gas.

The precursor gases and the reducing gas are either directly conveyed to the top of the CVD/CVI furnace (101) by a system of flexible hoses: this is the case of methane (102), the reducing gas hydrogen (103), and methyltrichlorosilane (MTS), precursor of SiC; or produced in an ex situ chlorination device (104) then conveyed to the CVD furnace via a pipe (105): this is the case of $HfCl_x$, precursor of HfC.

In FIG. 1 are also represented the supply circuits of vector gas argon (106) or nitrogen (107), and HCl (108), which supply the chlorination device (104).

Chlorination Device.

Figure 2:
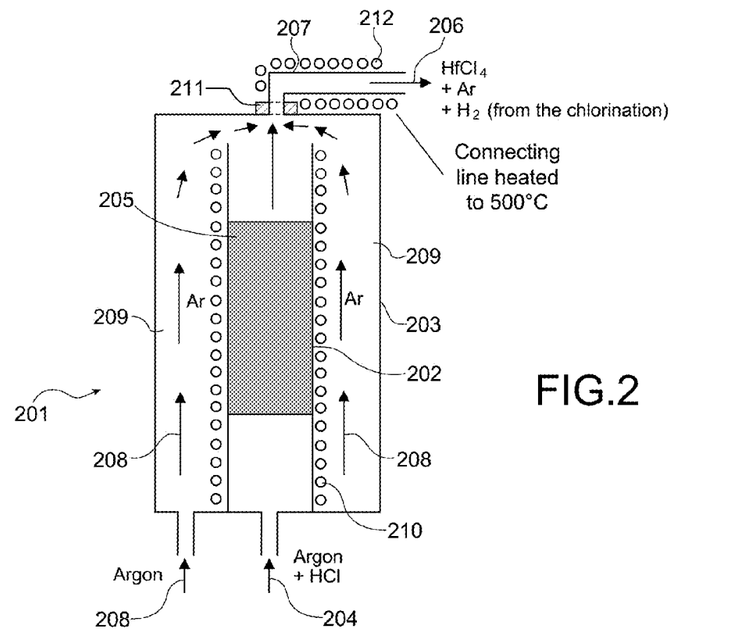
FIG. 2 is a schematic view in vertical section of the chlorination device that makes it possible to produce the compound $HfCl_x$, precursor of HfC.

The chlorination device or chlorination furnace also designated chlorination reactor, which makes it possible to produce $HfCl_x$, the precursor compound of HfC, is represented in FIG. 2.

This chlorination device is connected to the CVD/CVI deposition furnace.

It is a cylindrical resistance furnace (201), of a diameter of 300 mm and a height of 700 mm, with an inner (202) and outer (203) double shell and heated walls, the inner one of which is made of graphite.

The chlorination takes place by injecting a mixture of HCl and argon (arrow 204) used as vector gas, into a bed of hafnium metal (205) placed inside the device (201).

This mixture (204) reacts with the bed of hafnium metal (205) to form metal chlorides $HfCl_x$ and hydrogen.

The mixture of $HfCl_x$ and hydrogen is then conveyed in a current of vector gas (arrow 206) to the CVD deposition furnace, via a heated pipe (207).

Argon (arrows 208) is also injected into the space (209) defined between the two outer (203) and inner (202) shells of the chlorination device to inert the device and to avoid HCl or metal chlorides penetrating into this space (209).

The outer shell (203) is also cooled by a circuit of cooling fluid, such as water.

The maximum heating temperature in the chlorination furnace is 800° C. It is supplied by heating bands (210) that surround the inner shell (202).

In order not to favour the condensation of chlorides, in particular inside or at the outlet of the furnace, the minimal temperature throughout the installation during the implementation of the method must be above the condensation temperature of the chlorides.

The chloride $HfCl_4$, the majority, condenses at around 320° C. at atmospheric pressure and at 230° C. under reduced pressure. In order to ensure a margin of security and with the aim of avoiding phenomena of blocking at the outlet of the method, the minimal temperature has been fixed at 400° C. Thus, the outlet of the chlorination reactor, the first cold spot at the outlet of the furnace, is heated by a resistant heating band (211) to 400° C. and a temperature of 500° C. is applied to the heated pipe (207, 105) connecting the chlorination reactor (201, 104) to the CVD furnace (101).

This heated pipe (207, 105) may be constituted of a stainless steel flexible hose, around which is wound a heater cord (212) of around 3 meters, and a maximum heating temperature of 900° C.

Nevertheless, this pipe comprises several cold spots, possible seats of condensation phenomena.

Apart from the angled architecture of the line, a high temperature valve (109) isolating the chlorination reactor (104, 201) from the CVD furnace (101) has been put in place to isolate the chlorination reactor during the deposition of SiC for security reasons, which constitutes an important cold spot. A heating cord (400° C.) has been wound around this valve (109).

The metal charge used (205) is electrolytic grade hafnium. Such a hafnium is available for example from the firm CEZUS® under the reference SAQM 1032.

This charge (205) is placed in an interchangeable graphite cartridge machined on either side so as to allow gases to penetrate.

The impurities threshold (zirconium excluded) contained in the charge and announced by the supplier is below 0.4% and the level of oxygen, a major source of contamination, is of the order of 500 ppm.

Since the granulometry of the particles is disparate and generally comprised between 0.85 and 55 mm, a selection of the highest granulometric fraction, namely 5 mm to 55 mm, has been necessary.

SiC Precursor Supply System.

In parallel to the device enabling the deposition of HfC, a device enabling a deposition of SiC in the same deposition furnace (101) is included with a view to an alternating deposition of layers of HfC and SiC using CVD.

To do so, an oven (110) containing the precursor of the deposition of SiC, such as methyltrichlorosilane (MTS), is provided, which contains two $H_2$/precursor (MTS) mixing vessels, the hydrogen intervening in the CVD of the SiC by reducing successively the precursor.

This device (110) is maintained permanently at 50° C. in the case where the precursor is MTS, in order to maintain the MTS in gaseous form (MTS is in fact liquid at ambient temperature). It should be noted that the $H_2$ pipe (111) is common to the two methods of depositing HfC and SiC.

CVD/CVI Deposition Furnace.

Figure 3:
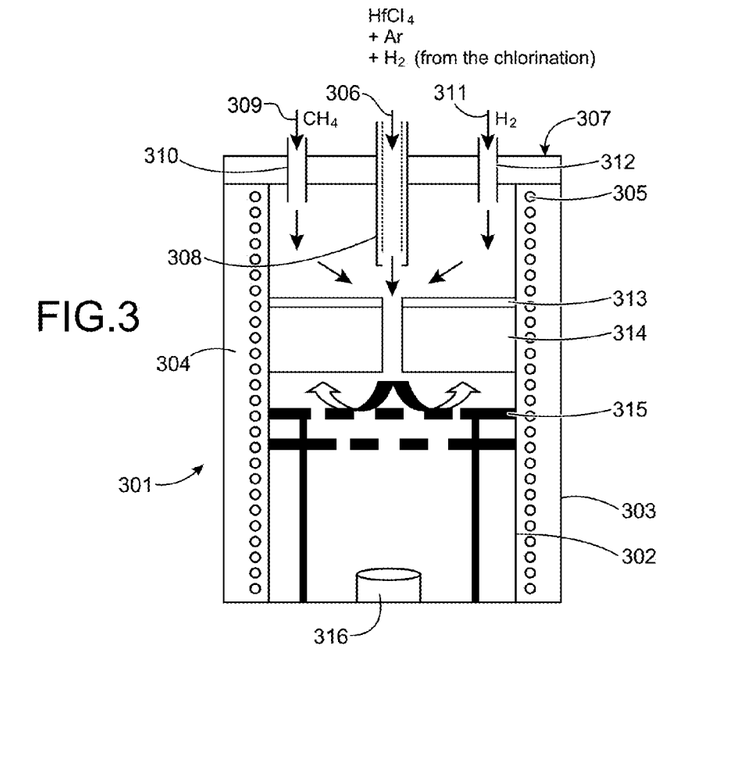
FIG. 3 is a schematic view in vertical section of a chemical vapour deposition CVD furnace implemented for the deposition of ceramic layers in the method of the invention.

The deposition of HfC by chemical vapour deposition CVD or chemical vapour infiltration CVI takes place in an inner (302) and outer (303) double shell furnace (301) with heated walls, of a total height of 180 cm (see FIG. 3).

The reaction zone is delimited by a silica tube of 120 mm diameter, forming the inner shell (302), within which circulate the reactive gases.

Nitrogen is injected into the space (304) defined between the two outer (303) and inner (302) shells in order to carry out a flushing by a flow of nitrogen in said space (304), and to inert the device The outer shell (303) is also cooled by a circuit of cooling fluid, such as water.

In addition, an inductive system with spires (305), insulators and a susceptor is situated in the space (304) between the inner shell (302) and the outer shell (303).

FIG. 3 schematizes the CVD deposition device and details the inflow and the circulation of gases within the reactor.

The conveyance of the products of the chlorination reaction of hafnium (namely $HfCl_x$, in particular $HfCl_4$ and $H_2$) in the vector gas (argon) (arrow 306) takes place at the top of the furnace (307) via a heated finger (308), heated to a temperature of 500° C., which is immersed to a depth of around 20 cm in the furnace (301) and makes it possible to avoid the condensation of chlorides at the inlet of the furnace. This finger (308) is constituted of a ¼ inch gas line covered with the heating cord of 3 m (see above), the whole being isolated from the furnace by the stainless steel shell of the finger.

The methane precursor gas (arrow 309) is also introduced at the top of the furnace (301) via a pipe (310).

Similarly, the hydrogen reducing gas (arrow 311) is introduced at the top of the furnace (301) via a pipe (312).

The mixture of the 4 types of gas, namely in the case of the deposition of HfC the two precursor gases $HfCl_x$ and $CH_4$, the reducing gas $H_2$ and the vector gas argon, is ensured by a system of successive chicanes enabling their homogenisation.

More specifically, baffles, deflectors, for example made of leak tight Papyex® (313), force the gases to pass through anti-radiation felts (314), then successive mixtures are ensured by a gas mixing device (315) comprising graphite baffles, deflectors.

The substrate (316) is placed in the middle of the hot zone of the furnace, for example around 15 cm high, which has been determined beforehand by creating a thermal profile of the furnace.

System for Treating Effluents and Gaseous Products that have not Reacted.

The system for treating and neutralizing effluents coming from the furnace (101) comprises (see FIG. 1) two traps (112, 113) cooled with liquid nitrogen placed in series, downstream of the furnace (101).

These traps (112, 113) make it possible to trap in particular a large amount of metal chlorides that have not reacted.

These traps are isolated from the furnace (101) by a manual valve (114) enabling the evacuation of the effluents at the end of the experiment.

Finally, a pumping system constituted of two pumps arranged in parallel ensures the vacuum in the device for the implementation of the method, as well as the treatment of the remaining effluents.

A vane-type pump (115) is used for the primary vacuum before and after the method of deposition, whereas it is a self-lubricating, dry, pump (116) that operates during the deposition.

The pumps (115, 116) are connected to the trap (113) via a pipe provided with a motorized valve (117).

Range and Management of Experimental Parameters.

In the installation for the implementation of the method according to the invention, it is possible to vary several parameters that govern this method and in particular the temperature, the pressure and the gas flow rates.

The control of temperatures in the installation takes place at five different spots, namely:
  in the chlorination reactor (104);
  in the heating band (211);
  in the two heating cords on the heated pipe and the valve;
  in the CVD/CVI furnace (101), where the heating power is controlled by a temperature regulator.

The pressure in the whole of the installation is adjustable between 2 kPa and atmospheric pressure thanks to a motorised butterfly valve situated upstream of the pumping system.

The increase up to the desired pressure during the implementation of the deposition method takes place thanks to a progressive injection of argon as regards the deposition of HfC, or instead thanks to a progressive injection of $H_2$ as regards the deposition of SiC.

It is interesting to note that an overpressure valve has been installed upstream of the chlorination furnace in the event of blockage, and that the whole of the installation is enslaved to a potential stoppage of the gases and the heating systems.

All the values of the flow rates are controlled by mass flow meters, apart from $N_2$, the flow rate of which is regulated by a bead flow meter.

Table 1 below gives the flow rate ranges (L/min) of the gases used in the method according to the invention.

TABLE 1

Range of flow rates (L/min) of the gases used.

| Gas considered | Range of min-max flow rates (L/min) |
|---|---|
| Methane | 0-2 |
| Hydrogen | 0-2 |
| Hydrogen chloride | 0-1 |
| Argon (vector gas) | 0-1 |
| Argon (double shell) | 0-4 |
| Methyltrichlorosilane | 0-0.5 |

The method according to the invention finds application in all fields where it is wished to produce dense and highly refractory coatings for protecting against oxidation on the surfaces of parts.

The method according to the invention enables the elaboration of coatings for protecting against oxidation in fields as diverse as aeronautics, aerospace, the chemical industry and, generally speaking, in all fields where very high temperatures are encountered.

In all these fields, the preparation of dense and highly refractory protections against oxidation, by a CVD/CVI method, had not until then been able to be carried out.

The invention will now be described with reference to the following examples, given by way of illustration and non-limiting.

EXAMPLES

Examples 1 to 3

In these examples, three samples known as sample 1, sample 2, and sample 3 are prepared then said samples are observed by Scanning Electron Microscope (SEM).

Each of these samples is constituted of a circular substrate of a diameter of 15 mm, and a thickness of 5 mm made of a dense (density above 90%) carbon/carbon (C/C) composite material provided with a coating for protecting against oxidation (PAO) constituted of an alternation of layers of SiC and HfC.

Sample 1 is a sample prepared, for comparative purposes, by a method that does not comply with the method according to the invention. Sample 1 comprises a substrate not having undergone any surface treatment prior to the deposition of the coating, said substrate being provided with a coating constituted of an alternation of 10 layers of SiC and HfC.

Sample 2 is identical to sample 1, with the difference nevertheless that, in sample 2, the substrate has received before the deposition of the coating a prior surface treatment. The substrate has in fact been coated, prior to the deposition of the coating, with a catalyst layer by simple dipping in a bath containing catalysts. Sample 2 differs moreover from sample 1 in that the coating with which the substrate is provided only comprises 5 layers according to the following succession: SiC—HfC—SiC—HfC—SiC.

Sample 3 is identical to sample 2, with the difference nevertheless that it is provided with five additional alternating layers of SiC and HfC, i.e. in total 10 alternating layers of SiC and HfC.

Sample 3 thus only differs from sample 1 by the fact that the substrate has received before the deposition of the coating, which has the same number of layers (10), a prior surface treatment.

The devices used for the deposition of the three coatings of the three samples are similar to those that have been described above.

The deposition parameters used for the deposition of the three coatings of the three samples are identical.

These deposition parameters are the following:
Constant pressure: 5 kPa
Temperature of the substrate: 1000° C.
Flow rates: $Q_{H2}/Q_{MTS}=4$ for the SiC layers $Q_{H2}/Q_{HfO4}=8.5$ for the HfC layers
Deposition time of each layer: 2 hours Which makes, without counting purging times, a duration of 10 hours to produce a coating of five layers.

The layers of SiC of the three coatings of the three samples are deposited according to the following procedure:

When the furnace is at the working temperature of 1000° C., the furnace still being maintained under vacuum, the $H_2$ valve is opened so as to obtain a pressure in the furnace of 5 kPa, which is regulated by means of the motorized valve.

When this pressure is reached, the MTS is introduced.

After a time of two hours, which is the time required to obtain the targeted deposition thickness of 2 μm, the supply of reactive gases is cut off.

A dynamic vacuum is then created for several minutes.

The layers of HfC of the three coatings of the three samples are deposited according to the following procedure:

The high temperature valve that connects the chlorination reactor to the CVD furnace is opened, the chlorination reactor and the heated lines having been started up beforehand.

An argon flush is carried out so as to obtain a pressure of 5 kPa regulated by the motorized valve. When this pressure is reached, hydrogen is introduced, then methane and finally HCl.

A time of 2 hours is required to obtain a deposition thickness of around 2 μm.

All the supplies of reactive gases (HCl, $CH_4$ and $H_2$) are then cut off.

Then a flush with argon is carried out for several minutes, then a dynamic vacuum is created for ten or so minutes before depositing a second layer of SiC.

Example 1

Comparative

In this example, sample 1 as described above is prepared. Sample 1 comprises a substrate not having undergone any surface treatment prior to the deposition of the coating, and on this substrate is deposited a coating constituted of an alternation of 10 layers of SiC and of HfC by the procedure as described above.

The overall thickness of the coating of 10 layers is 20 μm.

Figure 4:
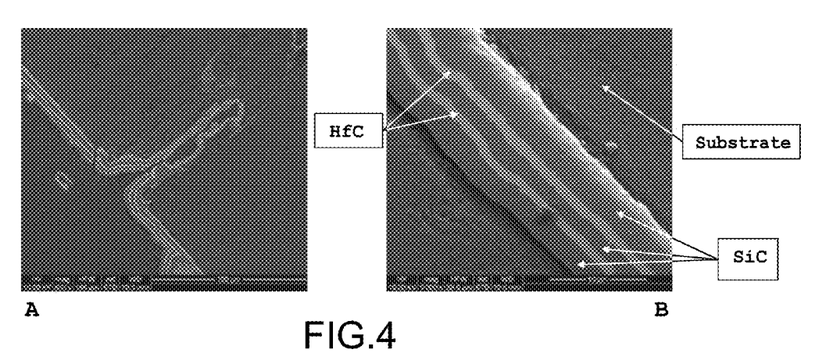
FIG. 4 shows images taken by Scanning Electron Microscope (SEM) at a magnification of 800 (A), or at a magnification of 5000 (B), of the five first layers deposited on a surface of a substrate made of C/C carbon/carbon composite in Example 1, (sample 1).

FIG. 4 (A and B) shows observations in section of the microstructure obtained after five layers and indicates a good integrity of the material of 10 μm thickness for 5 layers.

In FIG. 4B, which is an SEM image taken with a magnification of 5000, the substrate, the three layers of SiC, and the two layers of HfC are clearly visible.

It is interesting to note that all of the multi-sequenced material has been able to penetrate into the surface porosities of the substrate, showing that the deposition conditions employed are favourable to infiltration (FIG. 4A).

Example 2

According to the Invention

In this example, sample 2 as described above is prepared.

Prior to the deposition of the coating, the substrate is firstly coated with catalyst layer, by simple dipping of the substrate for 15 minutes in a bath of catalyst constituted of an aqueous slurry of fine particles (of a particle size of 10 nm to 3 μm) of Cu and Ni.

On this substrate is deposited a coating constituted of an alternation of 5 layers of SiC and of HfC, using the procedure as described above.

The thickness of the coating is 20 μm.

In other words, in this example 5, alternating depositions of SiC and of HfC are formed as in example 1 on a substrate made of C/C composite identical to that of example 1, with the difference that the substrate has undergone a surface treatment in a bath of catalysts so as to favour the creation of a "forest" of short fibres of SiC on the surface of the substrate during the first step of deposition of SiC.

This surface treatment of the substrate causes a more rapid growth of the first layer of SiC in the form of short fibres and fine particles.

Figure 5:
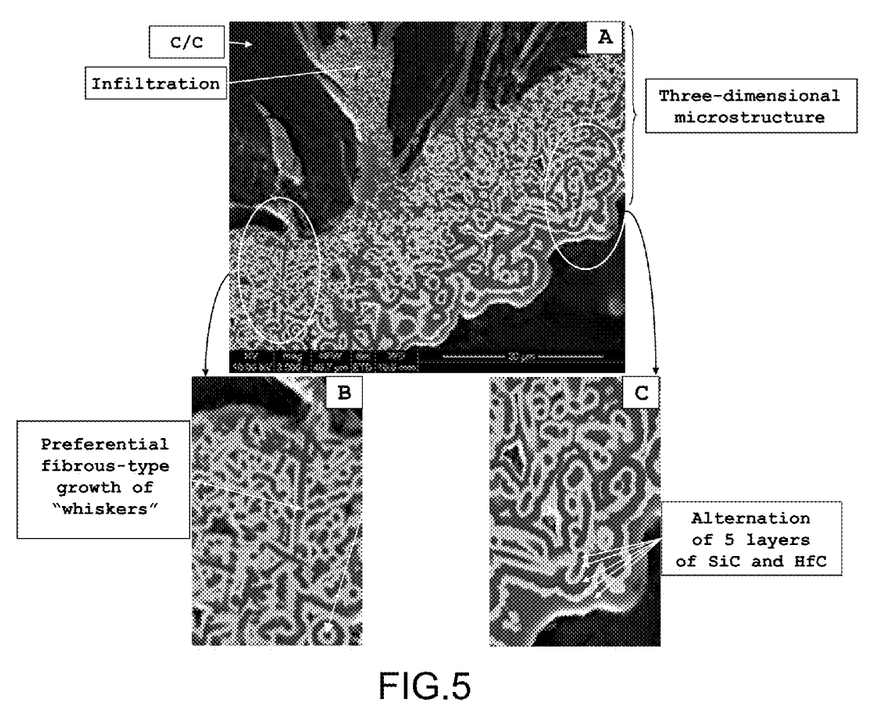
FIG. 5 shows images taken by Scanning Electron Microscope (SEM) at magnifications of 3000 (A) and 6000 (B and C) of the PAO coating deposited in example 2 (sample 2) according to the invention.

The microstructure of these depositions, shown in FIG. 5 (A, B, C), is different to the flat structure obtained in the case of the sample prepared in comparative example 1, without surface treatment (FIG. 4).

In fact, a deposition of total thickness of around 20 μm is obtained, constituted of an entanglement of silicon carbide having initially grown in various forms such as fibres (FIG. 5B) or fine particles. This assembly was, thereafter, covered with 4 layers, namely 2 layers of HfC and 2 layers of SiC, the layers of HfC and the layers of SiC being alternating, highlighting the multi-sequenced structure sought within the scope of the elaboration of a PAO (FIG. 5C).

With a view to subjecting these coatings to an oxidizing environment, this treatment has made it possible to attain sufficiently high overall deposition thicknesses (around twenty or so microns compared to ten microns without initial surface treatment) to be exposed to very high temperatures. This has been possible via a preferential growth of the first layer of SiC in the two forms described above.

It is also interesting to note that these successive depositions have led to a dense coating.

In addition, it may be remarked that the elaboration conditions used (5 kPa and 1000° C.) are favourable to the infiltration of the composite into the anfractuosities thereof. It is possible that this phenomenon is beneficial to the adherence of the coating as a whole, enabling a better resistance in oxidising environment.

Example 3

According to the Invention

In this example, sample 3 as described above is prepared.

Prior to the deposition of the coating, as in example 2, the substrate is firstly coated with a catalyst layer by simple dipping in a bath of catalyst as described above.

Then, on this substrate is deposited a coating identical to that of sample 1 constituted of an alternation of 10 layers of SiC and HfC, using the procedure as described above. Sample 3 is thus identical to sample 2 but it has received in addition five additional alternating layers of SiC and HfC; this with the aim of obtaining an optimal PAO having a complex microstructure with a three-dimensional microstructure as described for sample 2 and moreover a flat, planar, multilayer microstructure such as that described for sample 1.

Figure 6:
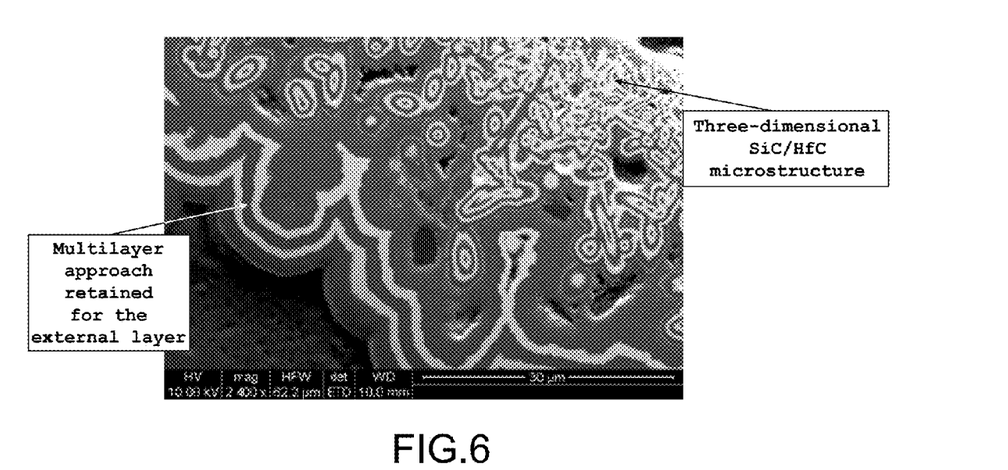
FIG. 6 shows an image taken by Scanning Electron Microscope (SEM) at a magnification of 2400 of the PAO coating deposited in example 3 (sample 3) according to the invention and constituted of 10 alternating SiC/HfC layers.

This complex microstructure is shown in FIG. 6, where the three-dimensional microstructure constituted of alternating layers of SiC and HfC and the external flat multilayer microstructure constituted of the five additional alternating layers of SiC and HfC may be clearly distinguished.

Even though some porosities unfortunately remain (due to a too high deposition rate of the 4th layer of SiC), this coating thus makes it possible to combine two PAO concepts, namely:

(1) a leak tight and continuous 2D alternation for the flat, planar, multi-sequencing of the layers of carbides for the external portion;

(2) a more complex 3D mixture based on the entanglement of several adherent structures or even penetrating structures into the substrate.

The high total thickness of this PAO, which is around 50 μm, could enable more efficient protection in extreme stress conditions.

Examples 4 to 5

In these examples, oxidation experiments at high temperature, namely at a temperature above 1500° C., of samples 1 and 3 prepared above are carried out.

These oxidation experiments above 1500° C. have been carried out using an arc image furnace.

This furnace is equipped with 6 lamps, each with a power of 7 kW, and enables the irradiation of flat parts. It moreover comprises a shutter to stop, when it is so wished, the luminous flux emitted by the lamps, and a flux meter to measure said flux.

This device, which makes it possible to attain temperatures under air of the order of 3000° C., can operate up to flux densities of 30 MW/m² without limitation over time with very rapid luminous flux powering up and powering down times, which are for example 0.2 to 5 seconds for the powering up and several seconds for the powering down.

For the study of the behaviour under air, the two samples have been subjected to a maximum temperature of 2000° C. (−0° C./+50° C.).

The temperatures are measured using thermocouples positioned at the heart of the sample, in the substrate, near to the surface of the substrate.

Figure 7:
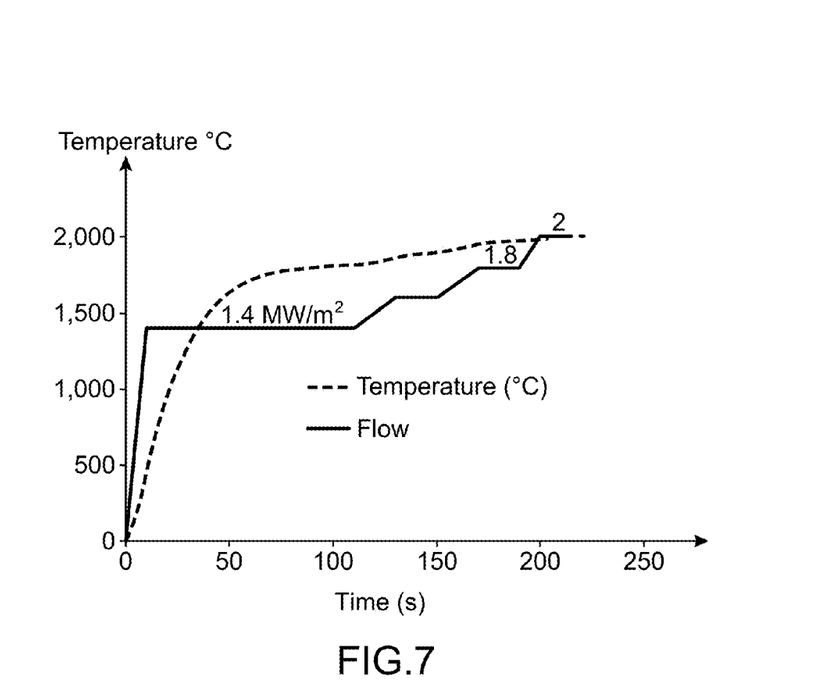
FIG. 7 is a graph that shows the temperature (in ° C.) and flow (in $MW/m^2$) profiles used during oxidation experiments at high temperature conducted using an arc image furnace, on samples 1 and 3 prepared above.

FIG. 7 shows the flow control slope that has been applied to all of the samples.

A plateau of 100 s is observed at 1.4 MW/m² then plateaux of 20 s at 1.6 MW/m², at 1.8 MW/m², and at 2 MW/m².

A camera makes it possible to follow directly the evolution of the material. As soon as the PAO is consumed, the experiment is stopped.

Example 4

In this example, the oxidation at high temperature of comparative sample N° 1 is studied, and the results of this oxidation are shown.

Sample N° 1, which has a 2D decalayer concept of the type of that described in document [10], has a better resistance up to 1800° C. In fact, it protects efficiently the C/C for 160 s, which corresponds to a maximum temperature of 1800° C. (−0° C./+50° C.) (see FIG. 7). Above this temperature, the PAO is totally consumed and the bare C/C deteriorates instantly.

Figure 8:
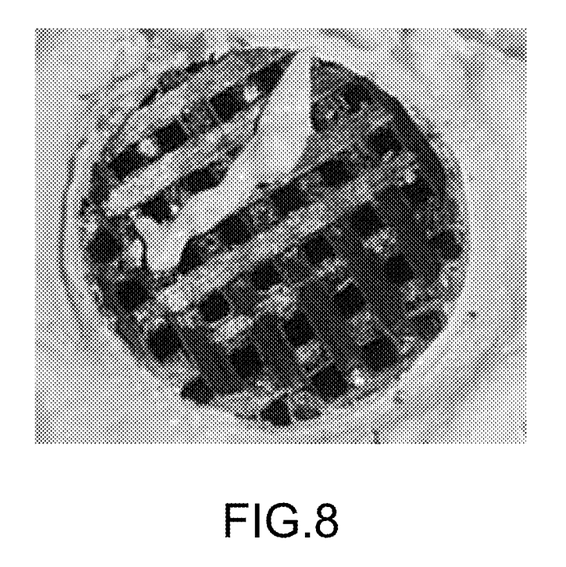
FIG. 8 is a photograph of the surface condition of sample 1, which is a 2D type decalayer sample after an oxidation treatment at high temperature (1800° C.), for a time of 160 seconds.

FIG. 8 shows a photograph of the surface condition of the material after 160 s. It is possible to make out that the quasi-totality of the PAO has disappeared and that the substrate made of C/C composite material is bare.

Example 5

In this example, the oxidation at high temperature of sample N° 3, according to the invention, is studied and the results of this oxidation are shown.

Figure 9:
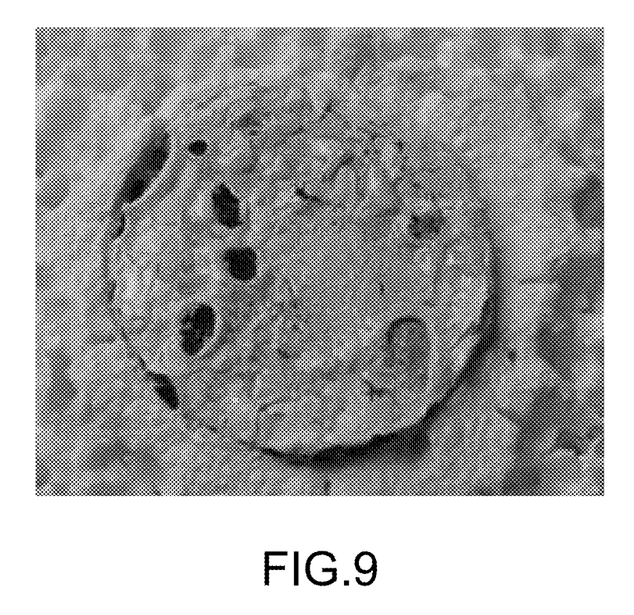
FIG. 9 is a photograph of the surface condition of sample 3, which is a 3D type decalayer sample after an oxidation treatment at high temperature (2000° C.), for a time of 205 seconds.

Sample N° 3, which has a 3D type PAO decalayer, according to the invention, has a PAO that is efficient up to 2000° C. (−0/+50° C.). In fact, it efficiently protects the C/C substrate for 205 s, a time that corresponds to a temperature of 2000° C. FIG. 9 shows a photograph of the surface of the coated C/C, in which it is possible to distinguish the highly oxidised but still adherent PAO. However, the C/C is beginning to appear.

REFERENCES

[1] D. W. Mc Kee, Chemistry and Physics of Carbon, Vol. 23, 173 (1991).
[2] U.S. Pat. No. 3,503,118.
[3] FR-A-1475529.
[4] WO-A-93/013033.
[5] D. W. McKee, Carbon, 25, 551 (1987).
[6] U.S. Pat. No. 3,775,137.
[7] U.S. Pat. No. 5,750,450.
[8] U.S. Pat. No. 4,668,583.
[9] K. H. Han, J. Electrochem. Soc. 134, 1003 (1987).
[10] R. B. Kaplan et al., U.S. Pat. No. 5,283,109 (1994).
[11] FR-A-2716208.

The invention claimed is:

1. Method for preparing a multilayer coating for protecting against oxidation on at least one surface of at least one part made of at least one material capable of being oxidized, wherein the following successive steps are carried out:
   (a) on the surface is deposited a layer of a catalyst enabling the growth of short fibres made of a ceramic that resists oxidation;
   (b) on the surface is grown, using a chemical vapour deposition CVD method or a chemical vapour infiltration CVI method, a first layer constituted of particles of a ceramic that resists oxidation, said particles comprising a majority of short fibres made of a ceramic that resists oxidation;
   (c) the first layer is coated, using a chemical vapour deposition CVD method or a chemical vapour infiltration CVI method, in a totally homogeneous manner, fibre by fibre and without leaving any porosity, with a second layer made of a refractory ceramic;
   (d) the second layer is coated, using a chemical vapour deposition CVD method or a chemical vapour infiltration CVI method, with a third layer made of a ceramic that resists oxidation;
   (e) optionally, the third layer is coated, using a chemical vapour deposition CVD method or a chemical vapour infiltration CVI method, with a fourth layer made of a refractory ceramic;
   (f) optionally the fourth layer is coated, using a chemical vapour deposition CVD method or a chemical vapour infiltration CVI method, with a fifth layer made of a ceramic that resists oxidation;
   (g) optionally steps (e) and (f) are repeated 1 to 100 times;
   (h) the part, coated on at least one of its surfaces with a refractory coating for protecting against oxidation, is recovered, said coating having a three-dimensional microstructure up to the third layer or up to the optional fifth layer; the ceramic that resists oxidation being different to the refractory ceramic.

2. Method according to claim 1, wherein said particles of the first layer comprise 100% short fibres.

3. Method according to claim 1, wherein the short fibres comprise a majority proportion of short fibres that are substantially perpendicular, or perpendicular, to the surface.

4. Method according to claim 1, wherein the material capable of being oxidized is selected from materials based on carbon; ceramics, carbide ceramics with the exception of SiC, nitride ceramics; composite ceramics; ultrarefractory metals; and carbon/ceramic composites.

5. Method according to claim 1, wherein the catalyst enabling the growth of short fibres is selected from particles of diamond; particles of at least one metal, and particles of mixtures and alloys thereof.

6. Method according to claim 1, wherein the short fibres have a length of 1 nm to 200 µm and a diameter of 50 nm to 1 µm.

7. Method according to claim 1, wherein the second layer has a thickness of 1 nm to 10 µm.

8. Method according to claim 1, wherein the third layer has a thickness of 1 nm to 10 µm.

9. Method according to claim 1, wherein the fourth layer has a thickness of 1 nm to 10 µm.

10. Method according to claim 1, wherein the fifth layer has a thickness of 1 nm to 10 µm.

11. Method according to claim 1, wherein all the layers from the second layer have the same thickness.

12. Method according to claim 1, wherein the refractory ceramic is selected from oxide ceramics, nitride ceramics, boride ceramics, carbide ceramics; mixtures thereof; and composite ceramics thereof.

13. Method according to claim 12, wherein the refractory ceramic is selected from metal carbides with the exception of SiC; mixtures of said metal carbides with each other, and mixtures of one or more of said metal carbides with SiC; composite ceramics of said metal carbides with each other, and composite ceramics of one or more of said metal carbides with SiC.

14. Method according to claim 1, wherein the ceramic that resists oxidation is selected from carbide ceramics, nitride ceramics, boride ceramics, oxide ceramics; mixtures thereof; and composite ceramics thereof; the ceramic that resists oxidation being different to the refractory ceramic.

15. Method according to claim 14, wherein the ceramic that resists oxidation is selected from SiC, TiN, ZrN, $HfB_2$, $ZrB_2$; mixtures thereof; and composite ceramics thereof.

16. Method according to claim 1, wherein the ceramic that resists oxidation is SiC and the refractory ceramic is HfC.

17. Method according to claim 1, wherein the particles of the first layer, the third layer, the fifth layer and the optional layers made of a ceramic that resists oxidation prepared during step (g) are constituted of a same ceramic; and the second layer, the fourth layer and the optional layers made of a refractory ceramic prepared during step (g) are constituted of a same ceramic.

18. Method according to claim 1, wherein the refractory coating for protecting against oxidation has a thickness of 4 nm to 1000 µm.

19. Method according to claim 1, wherein steps (b) to (g) are all carried out continuously in a same chemical vapour deposition CVD or chemical vapour infiltration CVI reactor.

20. Method according to claim 19, wherein steps (b) to (g), are all carried out at a same pressure of 0.5 to 50 kPa and at a same temperature of 700° C. to 1500° C.

21. Method according to claim 1, wherein the at least one material capable of being oxidized comprises a carbon/carbon composite material.

22. Method according to claim 1, wherein the part recovered in step (h) is protected against oxidation from 1200° C. to 2500° C. for up to 10 minutes.

* * * * *